United States Patent [19]

Nakagawa et al.

[11] Patent Number: 5,113,929
[45] Date of Patent: May 19, 1992

[54] TEMPERATURE CONTROL SYSTEM FOR SEMICONDUCTOR WAFER OR SUBSTRATE

[75] Inventors: Toshiyuki Nakagawa; Nobuyuki Takahashi; Takashi Akimoto, all of Fuchu, Japan

[73] Assignee: ANELVA Corporation, Tokyo, Japan

[21] Appl. No.: 680,939

[22] Filed: Apr. 5, 1991

[30] Foreign Application Priority Data

Apr. 9, 1990 [JP] Japan .................. 2-37890[U]

[51] Int. Cl.[5] .................................. F25B 29/00
[52] U.S. Cl. ........................... 165/61; 165/80.1; 165/80.5; 118/725
[58] Field of Search .............. 437/248; 118/724, 725, 118/728; 165/80.1, 80.4, 80.5, 185, 61

[56] References Cited

U.S. PATENT DOCUMENTS

| | | | |
|---|---|---|---|
| 4,282,924 | 8/1981 | Faretra | 165/80.5 |
| 4,508,161 | 4/1985 | Holden | 165/1 |
| 4,527,620 | 7/1985 | Pedersen et al. | 165/80.4 |
| 4,535,834 | 8/1985 | Turner | 165/80.1 |
| 4,609,037 | 9/1986 | Wheeler et al. | 165/61 |
| 4,671,204 | 6/1987 | Ballou | 118/59 |

*Primary Examiner*—Allen J. Flanigan
*Attorney, Agent, or Firm*—Wenderoth, Lind & Ponack

[57] ABSTRACT

A temperature control system is used in conjunction with sputtering, CDV, etching, and the like apparatuses for processing a substrate on which semiconductor devices are integrated. This system responds quickly to any change in the temperature of the substrate being processed, by heating or cooling the substrate to an appropriate temperature and maintaining it constant at such temperature. The heating is accomplished by radiant heaters which heat a gas flowing through the apparatus, which in turn transfers heat to the substrate mounted on the apparatus.

11 Claims, 3 Drawing Sheets

TEMPERATURE CONTROL SYSTEM FOR SEMICONDUCTOR WAFER OR SUBSTRATE

BACKGROUND OF THE INVENTION

1. Field of the Invention

The present invention relates to a temperature control system for a semiconductor wafer or substrate (which will be referred to as "substrate" hereafter), and more particularly to a system which controls the temperature of a substrate to be processed in a vacuum processing apparatus such as a sputtering apparatus, CVD apparatus, etching apparatus, or the like, by heating or cooling the substrate being processed in response to any changes in the temperature thereof.

2. Description of the Prior Art

It is known that a substrate to be processed in a vacuum processing apparatus such as a sputtering apparatus, CDV apparatus, etching apparatus, or the like is heated or cooled so that it can be maintained at a constant temperature.

There are various known types of temperature control systems that have been used to heat or cool the substrate being processed in a vacuum. There are also other types of temperature control systems that blow temperature-controlled cooling or heating gases (inert gases such as Argon gases, for example) from behind the substrate being processed in a vacuum (as disclosed in Japanese Patent Publications (not examined) No. 58-132937 and No. 62-50462).

Those types of temperature control systems which blow temperature-controlled gases onto the back of the substrate are arranged as shown in FIGS. 7 and 8.

In one type of the temperature control system as shown in FIG. 7, a substrate 1 to be processed is firmly held by a chuck 3 onto its holder 2, and the holder 2 has an aperture 4 extending therethrough, facing opposite the substrate 1. Gas is blown through a gas delivery conduit 5 onto the back of the substrate 1. A resistance thermal unit 6 is provided outside the holder 2, which heats the gas flowing through the gas delivery conduit 5. Cooling occurs by circulating water or other coolants through a circulating conduit 8 which is provided on a flange 7.

In another type of the temperature control system as shown in FIG. 8, a substrate 1 to be processed is firmly held by a chuck 3 onto its holder 2, and gas is blown through a delivery conduit 5 onto the back of the substrate 1. Heat is provided by a sheathed heater 9, which is embedded in the holder 2, and cooling occurs by circulating coolant or other mediums through a circulating conduit 8 which is provided in the holder 2.

The systems, shown in FIGS. 7 and 8, have a common problem in that they do not respond quickly to any changes in the temperature. Therefore, no adequate temperature control is provided.

In the system shown in FIG. 7, the resistance thermal unit 6 is exposed to the atmosphere. This may cause a thermal loss by allowing an escape of its heat into the atmosphere. The unit 6 has a large inherent thermal capacity which also prevents the system from responding quickly whenever any change in temperature occurs when a substrate is being processed. Thus, heating or cooling cannot be provided in good time.

In the system shown in FIG. 8, which includes the sheathed heater 9 embedded in the holder 2, the escape of the heat into the atmosphere may be avoided, but the holder 2 must be large, and accordingly must possess a large inherent thermal capacity heater. This would also prevent the system from responding quickly to any changes in the temperature when a substrate is being processed, and heating or cooling cannot be provided in good time.

When a substrate is being processed by any process such as sputtering, a certain time loss must be allowed for until the substrate is heated or cooled to the desired temperature whenever any change in the temperature thereof occurs. This time loss causes a corresponding reduction in the processing efficiency. For example, whenever the temperature in the substrate is raised by the heat produced by sputtering, it is difficult to control the power output of the heater so that the substrate can be maintained at a constant temperature.

SUMMARY OF THE INVENTION

In order to solve the above-described problems, it is one object of the present invention to provide a temperature control system for a substrate, which can eliminate any thermal loss in the heat source.

Another object is to provide a temperature control system for a substrate, which has a heat source with a smaller thermal capacity.

Still another object is to provide a temperature control system for a substrate, which responds quickly to any change in temperature that may occur when the substrate is being processed by any process such as sputtering, thereby permitting the sputtering process, etc. to proceed with greater efficiency.

In its specific form, the temperature control system according to the present invention includes a flanged plate which covers the opening of a vacuum chamber, a substrate holder mounted to the flanged plate, a gas delivery conduit extending through the flanged plate into the holder and through which an inert gas is blown onto the back of the substrate on the holder, a lamp heater or heaters for heating the substrate and which is mounted to the flanged plate opposite the holder, and a coolant circulating conduit installed within the flanged plate such that it faces the lamp heater(s). The lamp heater may be an infrared lamp, for example.

An inert gas that is blown onto the back of the substrate may be heated by the lamp heater or heaters which is not exposed to the atmosphere. Any possible thermal loss can be minimized, because a heat source with a relatively small thermal capacity, such as an infrared lamp, is used. Thus, a quick response may be attained whenever the substrate must be heated. Whenever the substrate must be cooled, a quick response may also be attained by the coolant circulating conduit, coupled with the small thermal capacity of each lamp heater located opposite the coolant circulating conduit. As the substrate can thus be heated or cooled quickly in response to any change in temperature that may be caused by any external heat source such as the heat produced during the sputtering process, it can be maintained at a constant temperature by controlling the output power of the lamp heater or heaters.

BRIEF DESCRIPTION OF THE DRAWINGS

These and other objects, features and advantages of the present invention will become more apparent from the detailed description of several preferred embodiments that follows by referring to the accompanying drawings, in which.

DETAILED DESCRIPTION OF THE PREFERRED EMBODIMENTS

Figure 1:
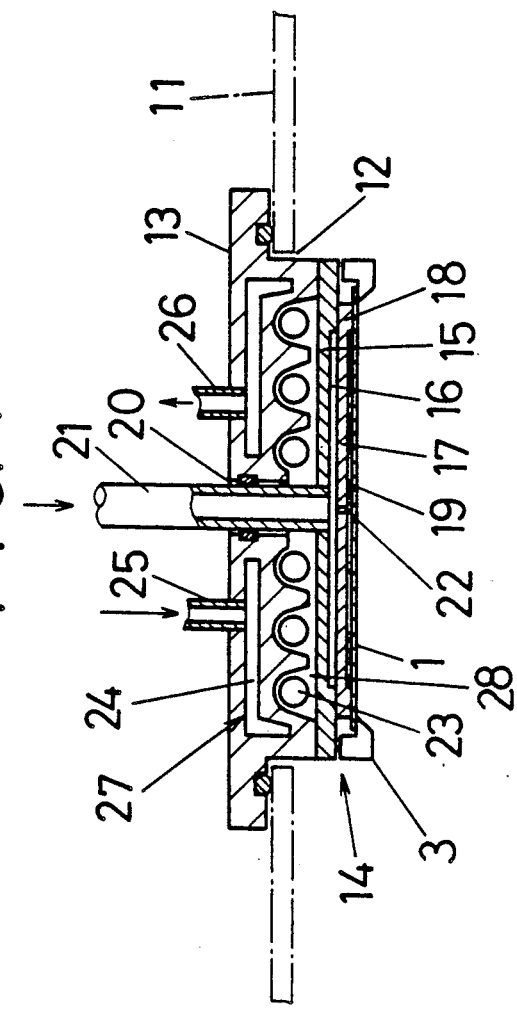
FIG. 1 is a sectional view of the first preferred embodiment of the present invention.

Referring first to FIG. 1, the first preferred embodiment of the present invention is described in further detail.

In FIG. 1, a vacuum chamber 11, partly shown by dash-dot-lines, has an opening 12 over which a flanged plate 13 is mounted. Inside the flanged plate 13, there is a holder assembly 14 to which a substrate 1 to be processed is to be secured by means of a chuck 3. The holder assembly 14 includes a separator plate 15 extending across the bottom of the flanged plate 13 and a support plate 17 spaced apart from a surface of the separator plate 15 so that a small gap 16 is defined between the two plates 15 and 17. The support plate 17 has an annular projection 18 extending from its peripheral edge. There is also a small gap 19 that is defined between the substrate firmly held by the chuck 3 and the main body of the support plate 17.

The flanged plate 13 has a center hole 20, and the separator plate 15 has a center hole. A gas delivery conduit 21 passes through the center hole 20 of the flanged plate 13, reaching the separator plate 15. The delivery conduit 21 communicates with the small gap 16. The support plate 17 also has a center hole 22 which is smaller in diameter than the center hole of separator plate 15. A gas from the delivery conduit 21 flows into the small gap 16, and then through the center hole 22 into the small gap 19, where the gas is blow onto the back of the substrate 1 being processed.

In a space 28 defined by the flanged plate 13 and separator plate 15, an array of lamp heaters 23, such as infrared lamps, is arranged to face opposite the separator plate 15. A hollow passage 24 is formed within the flanged plate 13 over the region where the array of infrared lamps is arranged. An inlet pipe 25 extends through the flanged plate 13 into the hollow passage 24, and an outlet pipe 26 extends from the hollow passage 24 and then through the flanged plate 13. The inlet and outlet pipes 25, 26 and the hollow passage 24 constitute a coolant (such as water) circulating path 27.

Whenever any change in the temperature occurs that requires heating the substrate being processed, an inert gas is delivered through the delivery conduit 21 into the small gap 16 where the inert gas is heated by the thermal energy transmitted through the separator plate from the array of infrared lamps 23. The heated inert gas flows through the small hole 22 to be blown against the back of the substrate. Whenever any change in the temperature occurs that requires cooling the substrate being processed, an inert gas is delivered through the delivery conduit 21 into the small gap 16 where the inert gas is cooled by the water or other cooling medium flowing through the circulating path 27 through the cooling of the separator plate 15. The cooled inert gas flows through the small hole 22 to be blown against the back of the substrate. In this way, the substrate 1 being processed may be heated or cooled to the required temperature by responding quickly to any changes in its temperature.

As described above, the heat supply source may include the array of infrared lamps 23 arranged between the flanged plate 13 and separator plate 15. The heat that is produced from the individual infrared lamps is enclosed minimizing the loss of heat that may occur by escaping into the atmosphere, and thus making it possible to utilize the produced heating effectively. Each individual infrared lamp has a small thermal capacity, and can respond quickly to any change in temperature that would require heating the substrate being processed. Because the coolant circulating path 27 faces the region where the array of infrared lamps 23 is located, any change in the temperature that would require cooling the substrate being processed can be quickly achieved. Thus, the cooling efficiency can be increased. This, coupled with the small thermal capacity, can increase the cooling speed.

As a result, the quick temperature control for the substrate to be processed can be provided without causing any time loss in the substrate processing. The output power of the array of infrared lamps 23 may be controlled so that the substrate 1 being processed can be maintained at a constant temperature, even if it is thermally affected by an external thermal source, such as the heat produced during the sputtering process.

Figure 2:
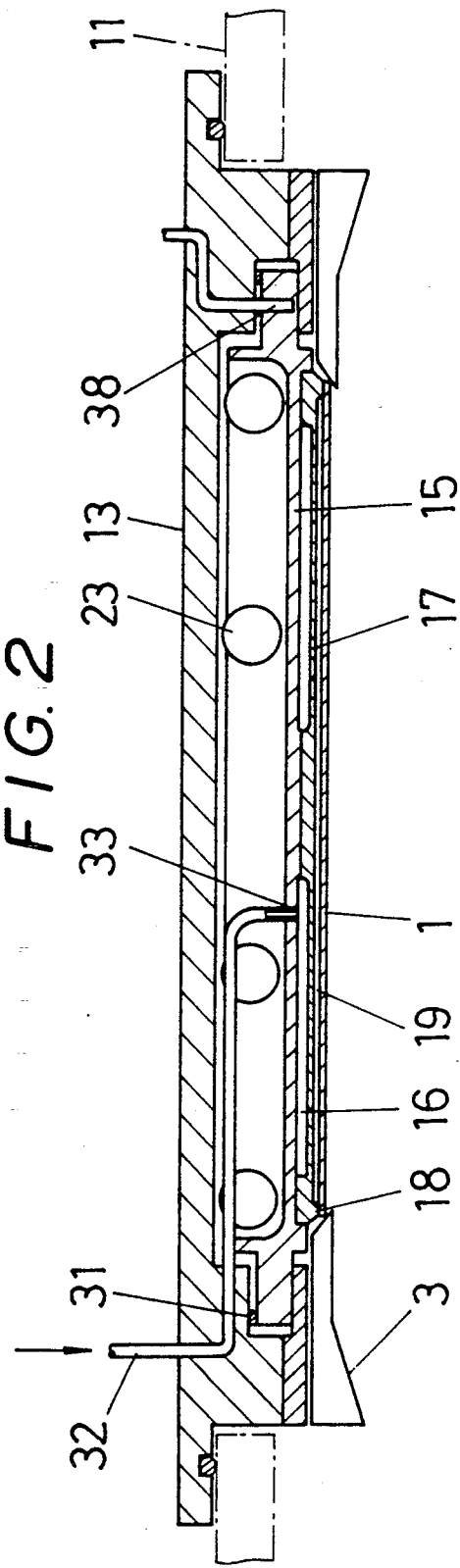
FIG. 2 is a sectional view of the second preferred embodiment of the present invention.

The following description is provided for the embodiment specifically designed to heat substrate up to the particular temperatures, as shown in FIG. 2 and subsequent figures.

According to this embodiment, an annular thermally insulating spacer 31 is interposed between the separator plate 15 and flanged plate 13. This spacer 31 reduces the contact area between the separator plate 15 and the flanged plate 13 cooled by the circulating water or other coolant mediums flowing through coolant circulating conduit. Also, the separator plate 15 may have an annular projection extending from its marginal edge in place of the spacer 31. The separator plate 15 and support plate 17 are joined by brazing their marginal edge and central portions engaged with each other. The separator plate 15 has a hole 33 through it for accepting the outlet end of a gas delivery conduit 32 passing through the flanged plate 13. The outlet end of the gas delivery conduit 32 in the hole 33 is also brazed to the separator plate 15. Thus, the small gap 16 that exists between the separator plate 15 and support plate 17 is closed airtightly. The separator plate 15 and support plate 17 should preferably be joined by brazing portions thereof central engaged with each other, but this may be omitted.

The support plate 17 has an annular projection 18 extending from its peripheral edge, which is similar to the one in the preceding embodiment. As described above, this annular projection 18 provides a small gap 19 between the support plate 17 and the substrate 1 to be processed. A hole means (not seen in the section taken in FIG. 2) extends through the support plate 17 to allow the gas from delivery conduit 32 to impinge the back of the substrate 1, similar to the hole 22 in the embodiment of FIG. 1. It is generally known that the smaller the gap 19 or the higher the gas pressure between the support plate 17 and the substrate 1, the better the heat transfer coefficient. For this reason, the annular projection 18 should desirably be as short as possible. However, if any partial contact should occur between the substrate 1 and support plate 17, there would be a difference in the temperature between the contact portions and non-contact portions. To avoid this, the annular projection 18 may be as short as possible, to the extent that the substrate 1 being processed cannot contact the support plate 17 anywhere.

According to the embodiment shown in FIG. 2, the small gap 16 is closed airtightly, which prevents any leakage of the heat transferring gas. Thus, the gas can be heated or cooled effectively. The thermal insulating spacer 31, which is interposed between the separator plate 15 and flanged plate 13, allows the separator plate 15 to provide the higher heat efficiency. The quick temperature control may be provided for elevating the temperature of the substrate 1 (such as up to between about 500° C. and about 600° C.).

The following describes the results obtained from a series of experiments that were conducted in order to demonstrate the features of the present invention that have been described so far.

Figure 3:
FIG. 3 is a schematic diagram illustrating the relationships between the gap distances between the substrate to be processed and a support plate, and the resulting pressures.

FIG. 3 shows the relationships between the gap distances and the resulting pressures in the gap 19 when an argon gas is delivered at a constant flow rate through the gas delivery conduits 21, 32. In this diagram, the letter "a" designates the embodiment shown in FIG. 1 where a small gap of 0.8 mm is provided, the letter "b" designates the embodiment shown in FIG. 2 where a small gap of 0.8 mm is provided, the letter "c" designates the embodiment in FIG. 2 where a small gap of 0.2 mm is provided, and the letter "d" designates the embodiment shown in FIG. 2 where a small gap of 0 mm is provided, that is, the wafer 1 and support plate 17 contact each other.

It may be seen from the results in FIG. 3 that the closed-type embodiment of FIG. 2 allows for higher pressures in the small gap 19, and therefore provides a higher heat transfer coefficient between the support plate 17 and wafer 1 than the embodiment of FIG. 1. It may also be seen that in the embodiment of FIG. 2, the smaller the gap 19, the higher the heat transfer coefficient.

Next, an experiment was conducted to determine the rising temperature characteristics of the substrate 1 while being heated. The temperature of a silicon wafer was measured by attaching a chromel-almel thermocouple to the silicon wafer. The temperature of the separator plate 15 was measured by the chromel-almel thermocouple 38 as shown in FIG. 2. In this case, an argon gas was delivered.

Figure 4:
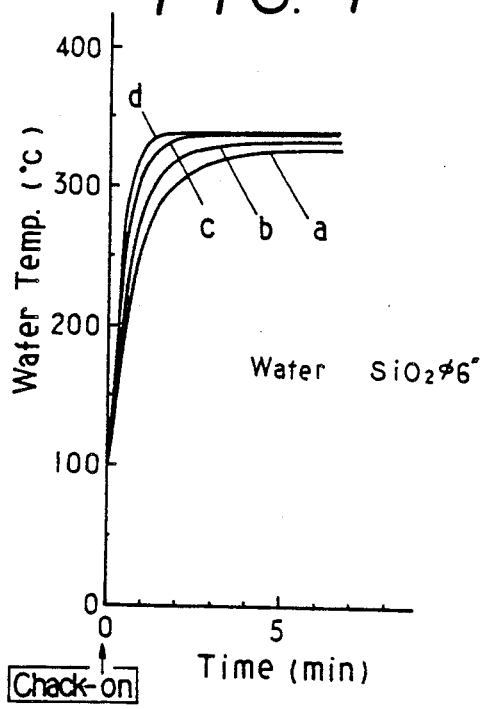
FIG. 4 represents the rising temperature characteristics curve for the substrate being processed, when its support plate is maintained at about 340° C.

FIG. 4 shows the rising temperature characteristics curve for a 6-inch diameter silicon wafer. The letters "a", "b", "c", and "d" correspond to those in FIG. 3, respectively. FIG. 4 clearly shows the different heat transfer coefficients, depending upon the different heat transfer coefficients shown in FIG. 3.

Figure 5:
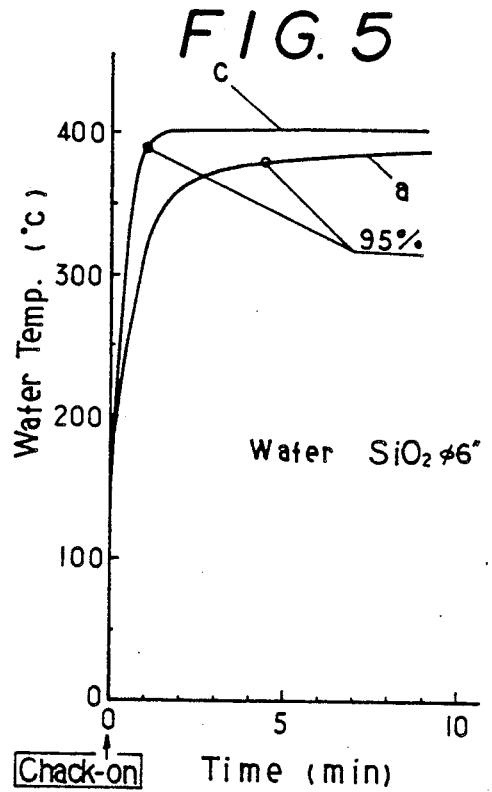
FIG. 5 represents the rising temperature characteristics curve for the substrate to be processed, when its support plate is maintained at about 400° C.

FIG. 5 shows the rising temperature characteristics curve for the types "a" and "c". As seen from FIG. 5, for the type "a", it takes 270 seconds until it has reached 95% of the saturation temperature (about 380° C.) of the wafer 1 while for the type "c", it takes 60 seconds until it has reached 95% of the saturation temperature (about 400° C.). This shows that the closed-type embodiment of FIG. 2 can effect a rise in temperature at four times the speed of the embodiment of FIG. 1.

Figure 6:
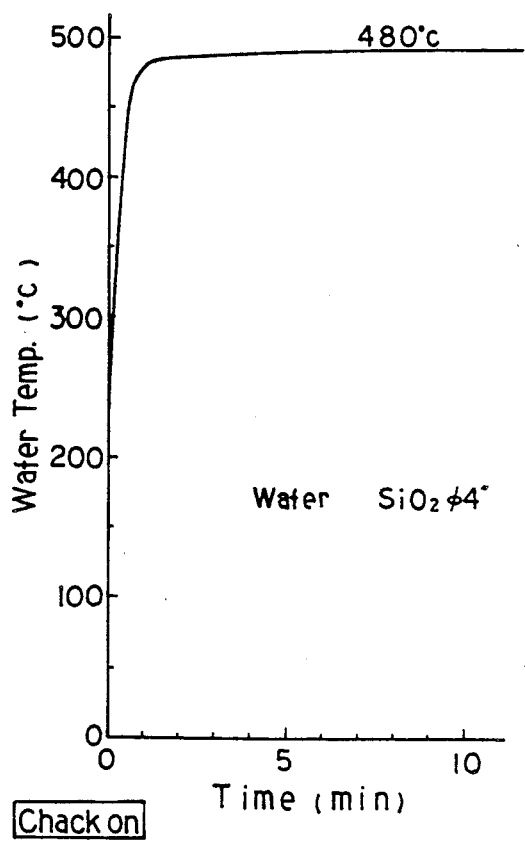
FIG. 6 represents the rising temperature characteristics curve for the substrate to be processed, when its support plate is maintained at 480° C.
Figure 7:
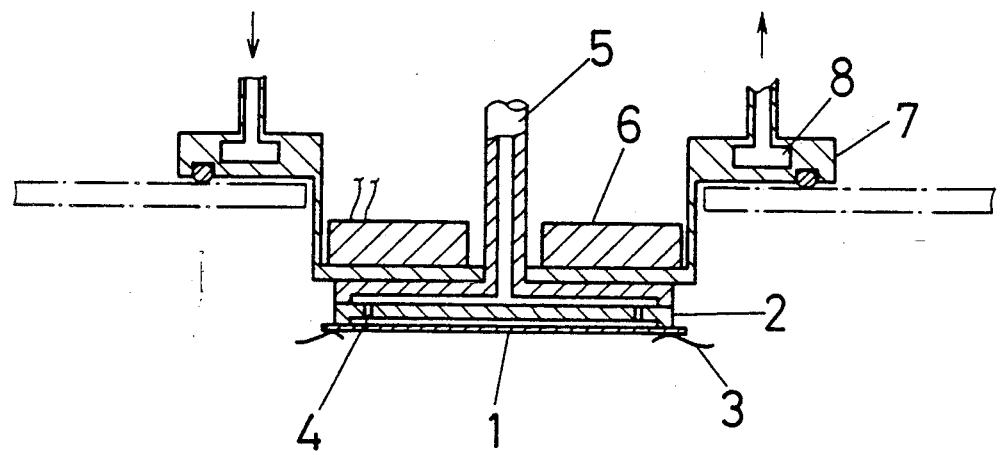
FIGS. 7 and 8 are sectional views of the prior art substrate temperature control systems, respectively.
Figure 8:
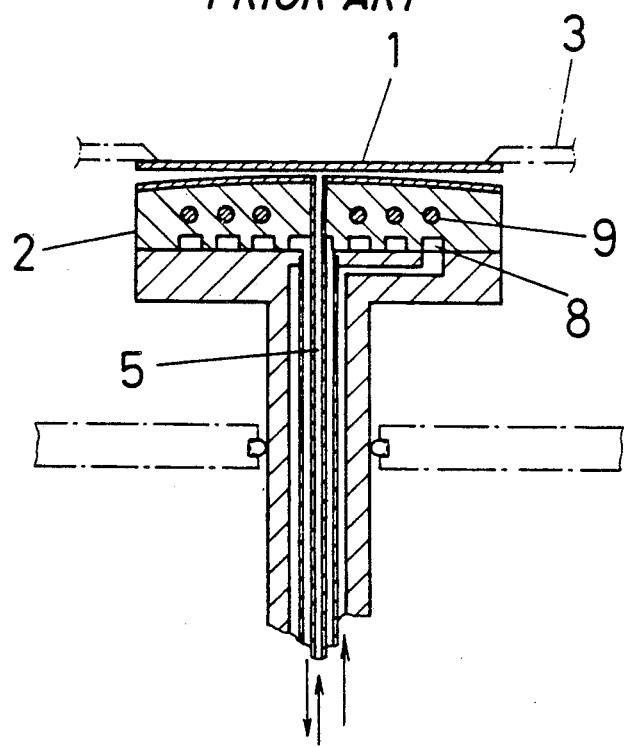

FIG. 6 shows the rising temperature characteristics curve for a four-inch diameter silicon wafer in the type "c". The saturation temperature of 480° C. can be reached.

The separator plate 15 is made of copper, and the side of the separator plate 15 facing opposite the infrared lamp 23 is not so specially treated as to absorb the radiant heat from the lamp. Of course, however, this side may be treated so as to absorb the radiant heat from the infrared lamp 23 efficiently. In this way, the substrate 1 can be heated with improved thermal efficiency. For example, the preferred method of treating that side of the separator plate 15 may include the black coating process that consists of forming a chrome oxydized film or cermet film (mixed film of $TiO_2$ and $Al_2O_3$) by melt injection.

In the existing aluminum printing technology for semiconductor devices, there is a step coverage problem that occurs when a thin film of aluminum is deposited to provide high aspect ratio of contact parts. The approach to this problem that has actually been used in this existing technology consists of heating the wafer to above 400° C., followed by aluminum sputtering process. This approach actually provides uniform step coverage. In this sense, the various forms of temperature control systems according to the present invention, particularly the embodiment shown in FIG. 2, may be used in conjunction with the existing technology, and may provide an effective temperature control.

It may be appreciated from the foregoing description that the various preferred embodiments of the present invention provide a quick temperature control, which may advantageously be used in the sputtering, CDV, etching, and like processes to increase their respective processing capabilities and speeds. They also provide the accurate temperature control that allows the substrate to be processed to be heated or cooled to any desired temperature, without affecting the substrate thermally.

In the sputtering and other processes, any change in the temperature of the substrate to be processed is an important factor that influences their respective processing capabilities, but the present invention can provide the accurate temperature control by responding quickly to such changes, without affecting the processing capabilities.

Although the present invention has been described with reference to the several preferred embodiments thereof, it should be understood that various changes and modifications may be made without departing from the spirit and scope of the invention.

What is claimed is:

1. A temperature control system for controlling the temperature of a substrate to be processed, said system comprising:

a vacuum chamber having a top defining an opening therethrough;

a flanged member covering the opening in the top of said vacuum chamber;

holder means, provided on said flanged member, for supporting a substrate to be processed within said vacuum chamber;

gas delivery conduit means, extending through said flanged member and toward said holder means, for directing gas onto the back of the substrate when held by said holder means;

radiant heater means, mounted to said flanged member and facing said holder means, for radiating heat to heat gas flowing through said delivery conduit means; and coolant circulating conduit means, mounted within said flanged member and facing the region where said radiant heater means is located, for directing coolant in a circulating path through said flanged member to cool gas flowing through said delivery conduit means.

2. A temperature control system as defined in claim 1, wherein said holder means includes a separator plate member facing opposite said radiant heater means, and a support plate member facing opposite the location at which the substrate is to be supported by said holder means, said support plate member and said separator plate member defining a small gap therebetween, and wherein said gas delivery conduit means communicates with the small gap between said separator plate member and said support plate member.

3. A temperature control system as defined in claim 2, wherein said support plate member has an aperture therethrough open to said location at which the substrate is to be supported by said holder means, whereby gas from said gas delivery conduit means entering the small gap between said separator plate member and said support plate member is forced against the back of the substrate through said aperture.

4. A temperature control system as defined in claim 2, wherein said separator plate member includes thermally insulating spacer means engaging said flanged member for thermally insulating said separator plate member from said flanged member.

5. A temperature control system as defined in claim 2, wherein said thermally insulating spacer means is an annular projection extending from the marginal edge of said separator plate member.

6. A temperature control system as defined in claim 2, wherein said small gap between said separator plate member and said support plate member is closed in an airtight manner.

7. A temperature control system as defined in claim 2, wherein said support plate member includes annular projection means, extending from the edge of said support plate member facing opposite said location at which the substrate is to be supported by said holder means, for keeping said support plate member apart from the substrate when supported by said holder means.

8. A temperature control system as defined in claim 6, wherein the peripheral marginal edges of said separator plate member and support plate member are joined by brazing, and said separator plate member and said gas delivery conduit means are joined by brazing.

9. A temperature control system as defined in claim 2, wherein said separator plate member has a treated surface facing opposite said radiant heater means which absorbs the radiant heat from said radiant heater means efficiently.

10. A temperature control system as defined in claim 9, wherein said treated surface of said separator plate member facing opposite said radiant heater means comprises one of a chrome oxydized film, cermet film and black film coating on said surface.

11. A temperature control system as defined in claim 10, wherein said treated surface is a cermet film of a mixture of $TiO_2$ and $Al_2O_3$.

* * * * *